(12) United States Patent
Gose et al.

(10) Patent No.: US 12,103,406 B2
(45) Date of Patent: Oct. 1, 2024

(54) SYSTEMS AND METHODS FOR INTEGRATED GATE DRIVER FOR INVERTER FOR ELECTRIC VEHICLE

(71) Applicant: Delphi Technologies IP Limited, St. Michael (BB)

(72) Inventors: Mark Wendell Gose, Kokomo, IN (US); Seyed R. Zarabadi, Kokomo, IN (US); David Paul Buehler, Noblesville, IN (US); Kevin M. Gertiser, Carmel, IN (US)

(73) Assignee: Delphi Technologies IP Limited, St. Michael (BB)

( * ) Notice: Subject to any disclaimer, the term of this patent is extended or adjusted under 35 U.S.C. 154(b) by 0 days.

(21) Appl. No.: 18/161,974

(22) Filed: Jan. 31, 2023

(65) Prior Publication Data

US 2024/0106346 A1    Mar. 28, 2024

Related U.S. Application Data

(60) Provisional application No. 63/378,601, filed on Oct. 6, 2022, provisional application No. 63/377,486, filed
(Continued)

(51) Int. Cl.
*B60L 50/51*    (2019.01)
*B60L 3/00*    (2019.01)
(Continued)

(52) U.S. Cl.
CPC ............... *B60L 50/60* (2019.02); *B60L 3/003* (2013.01); *B60L 15/007* (2013.01); *B60L 15/08* (2013.01);
(Continued)

(58) Field of Classification Search
CPC .......... H02M 7/537; H02M 1/08; B60L 50/51
See application file for complete search history.

(56) References Cited

U.S. PATENT DOCUMENTS

| 4,054,828 A | 10/1977 | Conzelmann et al. |
|---|---|---|
| 4,128,801 A | 12/1978 | Gansert et al. |

(Continued)

FOREIGN PATENT DOCUMENTS

| EP | 2157689 A1 | 2/2010 |
|---|---|---|
| EP | 3703257 A2 | 9/2020 |

(Continued)

OTHER PUBLICATIONS

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&ref_url=https%253A%252F%252Fwww.google.com%252F.

(Continued)

*Primary Examiner* — Robert L Deberadinis
(74) *Attorney, Agent, or Firm* — Joshua M. Haines; Bookoff McAndrews, PLLC

(57) ABSTRACT

A system includes: an inverter configured to convert DC power from a battery to AC power to drive a motor, wherein the inverter includes: a first power module including: a first connection; a second connection; a first power switch including a first gate terminal, the first power switch configured to control a first flow of current between the first connection and the second connection based on a first signal to the first gate terminal; and a first point-of-use controller configured to provide the first signal to the first gate terminal to control the first power switch.

20 Claims, 8 Drawing Sheets

Related U.S. Application Data on Sep. 28, 2022, provisional application No. 63/377,512, filed on Sep. 28, 2022, provisional application No. 63/377,501, filed on Sep. 28, 2022.

(51) Int. Cl.

| | | |
|---|---|---|
| *B60L 15/00* | (2006.01) | |
| *B60L 15/08* | (2006.01) | |
| *B60L 50/40* | (2019.01) | |
| *B60L 50/60* | (2019.01) | |
| *B60L 50/64* | (2019.01) | |
| *B60L 53/20* | (2019.01) | |
| *B60L 53/22* | (2019.01) | |
| *B60L 53/62* | (2019.01) | |
| *B60R 16/02* | (2006.01) | |
| *G01R 15/20* | (2006.01) | |
| *G06F 1/08* | (2006.01) | |
| *G06F 13/40* | (2006.01) | |
| *H01L 21/48* | (2006.01) | |
| *H01L 23/00* | (2006.01) | |
| *H01L 23/15* | (2006.01) | |
| *H01L 23/367* | (2006.01) | |
| *H01L 23/373* | (2006.01) | |
| *H01L 23/40* | (2006.01) | |
| *H01L 23/467* | (2006.01) | |
| *H01L 23/473* | (2006.01) | |
| *H01L 23/495* | (2006.01) | |
| *H01L 23/538* | (2006.01) | |
| *H01L 25/00* | (2006.01) | |
| *H01L 25/07* | (2006.01) | |
| *H01L 29/66* | (2006.01) | |
| *H02J 7/00* | (2006.01) | |
| *H02M 1/00* | (2006.01) | |
| *H02M 1/08* | (2006.01) | |
| *H02M 1/084* | (2006.01) | |
| *H02M 1/088* | (2006.01) | |
| *H02M 1/12* | (2006.01) | |
| *H02M 1/32* | (2007.01) | |
| *H02M 1/42* | (2007.01) | |
| *H02M 1/44* | (2007.01) | |
| *H02M 3/335* | (2006.01) | |
| *H02M 7/00* | (2006.01) | |
| *H02M 7/537* | (2006.01) | |
| *H02M 7/5387* | (2007.01) | |
| *H02M 7/5395* | (2006.01) | |
| *H02P 27/06* | (2006.01) | |
| *H02P 27/08* | (2006.01) | |
| *H02P 29/024* | (2016.01) | |
| *H02P 29/68* | (2016.01) | |
| *H05K 1/14* | (2006.01) | |
| *H05K 1/18* | (2006.01) | |
| *H05K 5/02* | (2006.01) | |
| *H05K 7/20* | (2006.01) | |
| *B60L 15/20* | (2006.01) | |
| *H03K 19/20* | (2006.01) | |

(52) U.S. Cl.
CPC .............. *B60L 50/40* (2019.02); *B60L 50/51* (2019.02); *B60L 50/64* (2019.02); *B60L 53/20* (2019.02); *B60L 53/22* (2019.02); *B60L 53/62* (2019.02); *B60R 16/02* (2013.01); *G01R 15/20* (2013.01); *G06F 1/08* (2013.01); *G06F 13/4004* (2013.01); *H01L 21/4882* (2013.01); *H01L 23/15* (2013.01); *H01L 23/3672* (2013.01); *H01L 23/3675* (2013.01); *H01L 23/3735* (2013.01); *H01L 23/4006* (2013.01); *H01L 23/467* (2013.01); *H01L 23/473* (2013.01); *H01L 23/49562* (2013.01); *H01L 23/5383* (2013.01); *H01L 24/32* (2013.01); *H01L 24/33* (2013.01); *H01L 25/072* (2013.01); *H01L 25/50* (2013.01); *H01L 29/66553* (2013.01); *H02J 7/0063* (2013.01); *H02M 1/0009* (2021.05); *H02M 1/0054* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/327* (2021.05); *H02M 1/4258* (2013.01); *H02M 1/44* (2013.01); *H02M 3/33523* (2013.01); *H02M 7/003* (2013.01); *H02M 7/537* (2013.01); *H02M 7/5387* (2013.01); *H02M 7/53871* (2013.01); *H02M 7/53875* (2013.01); *H02M 7/5395* (2013.01); *H02P 27/06* (2013.01); *H02P 27/08* (2013.01); *H02P 27/085* (2013.01); *H02P 29/024* (2013.01); *H02P 29/027* (2013.01); *H02P 29/68* (2016.02); *H05K 1/145* (2013.01); *H05K 1/181* (2013.01); *H05K 1/182* (2013.01); *H05K 5/0247* (2013.01); *H05K 7/20154* (2013.01); *H05K 7/2049* (2013.01); *H05K 7/20854* (2013.01); *H05K 7/209* (2013.01); *H05K 7/20927* (2013.01); *B60L 15/20* (2013.01); *B60L 2210/30* (2013.01); *B60L 2210/40* (2013.01); *B60L 2210/42* (2013.01); *B60L 2210/44* (2013.01); *B60L 2240/36* (2013.01); *G06F 2213/40* (2013.01); *H01L 2023/405* (2013.01); *H01L 2023/4087* (2013.01); *H01L 2224/32225* (2013.01); *H01L 2224/32245* (2013.01); *H01L 2224/33181* (2013.01); *H02J 2207/20* (2020.01); *H02P 2207/05* (2013.01); *H03K 19/20* (2013.01); *H05K 2201/042* (2013.01); *H05K 2201/10166* (2013.01)

(56) References Cited

U.S. PATENT DOCUMENTS

| | | |
|---|---|---|
| 4,564,771 A | 1/1986 | Flohrs |
| 4,618,875 A | 10/1986 | Flohrs |
| 4,716,304 A | 12/1987 | Fiebig et al. |
| 5,068,703 A | 11/1991 | Conzelmann et al. |
| 5,432,371 A | 7/1995 | Denner et al. |
| 5,559,661 A | 9/1996 | Meinders |
| 5,654,863 A | 8/1997 | Davies |
| 5,764,007 A | 6/1998 | Jones |
| 5,841,312 A | 11/1998 | Mindl et al. |
| 6,028,470 A | 2/2000 | Michel et al. |
| 6,163,138 A | 12/2000 | Kohl et al. |
| 6,351,173 B1 | 2/2002 | Ovens et al. |
| 6,426,857 B1 | 7/2002 | Doster et al. |
| 6,597,556 B1 | 7/2003 | Michel et al. |
| 6,812,553 B2 | 11/2004 | Gerbsch et al. |
| 6,943,293 B1 | 9/2005 | Jeter et al. |
| 7,095,098 B2 | 8/2006 | Gerbsch et al. |
| 7,229,855 B2 | 6/2007 | Murphy |
| 7,295,433 B2 | 11/2007 | Taylor et al. |
| 7,459,954 B2 | 12/2008 | Kuehner et al. |
| 7,538,425 B2 | 5/2009 | Myers et al. |
| 7,551,439 B2 | 6/2009 | Peugh et al. |
| 7,616,047 B2 | 11/2009 | Rees et al. |
| 7,724,046 B2 | 5/2010 | Wendt et al. |
| 7,750,720 B2 | 7/2010 | Dittrich |
| 9,088,159 B2 | 7/2015 | Peuser |
| 9,275,915 B2 | 3/2016 | Heinisch et al. |
| 9,373,970 B2 | 6/2016 | Feuerstack et al. |
| 9,431,932 B2 | 8/2016 | Schmidt et al. |

(56) References Cited

U.S. PATENT DOCUMENTS

| | | |
|---|---|---|
| 9,515,584 B2 | 12/2016 | Koller et al. |
| 9,548,675 B2 | 1/2017 | Schoenknecht |
| 9,806,607 B2 | 10/2017 | Ranmuthu et al. |
| 9,843,320 B2 | 12/2017 | Richter et al. |
| 9,871,444 B2 | 1/2018 | Ni et al. |
| 9,882,490 B2 | 1/2018 | Veeramreddi et al. |
| 10,111,285 B2 | 10/2018 | Shi et al. |
| 10,116,300 B2 | 10/2018 | Blasco et al. |
| 10,232,718 B2 | 3/2019 | Trunk et al. |
| 10,270,354 B1 | 4/2019 | Lu et al. |
| 10,291,225 B2 | 5/2019 | Li et al. |
| 10,525,847 B2 | 1/2020 | Strobel et al. |
| 10,797,579 B2 | 10/2020 | Hashim et al. |
| 10,924,001 B2 | 2/2021 | Li et al. |
| 11,082,052 B2 | 8/2021 | Jang et al. |
| 11,108,389 B2 | 8/2021 | Li et al. |
| 11,342,911 B2 | 5/2022 | Lee et al. |
| 11,838,011 B2 | 12/2023 | Li et al. |
| 11,843,320 B2 | 12/2023 | Sivakumar et al. |
| 11,848,426 B2 | 12/2023 | Zhang et al. |
| 11,851,038 B2 | 12/2023 | Solanki et al. |
| 11,855,522 B2 | 12/2023 | Rudolph et al. |
| 11,855,630 B2 | 12/2023 | Dake et al. |
| 11,870,338 B1 | 1/2024 | Narayanasamy |
| 11,872,997 B2 | 1/2024 | Hoos et al. |
| 11,881,859 B2 | 1/2024 | Gupta et al. |
| 11,888,391 B2 | 1/2024 | Balasubramanian et al. |
| 11,888,393 B2 | 1/2024 | Venkateswaran et al. |
| 11,901,803 B2 | 2/2024 | Ruck et al. |
| 11,901,881 B1 | 2/2024 | Narayanasamy |
| 11,909,319 B2 | 2/2024 | Esteghlal et al. |
| 11,916,426 B2 | 2/2024 | Oner et al. |
| 11,923,762 B2 | 3/2024 | Sethumadhavan et al. |
| 11,923,764 B1 | 3/2024 | Zhang |
| 11,923,799 B2 | 3/2024 | Ojha et al. |
| 11,925,119 B2 | 3/2024 | Male et al. |
| 11,927,624 B2 | 3/2024 | Patel et al. |
| 11,938,838 B2 | 3/2024 | Simonis et al. |
| 11,942,927 B2 | 3/2024 | Purcarea et al. |
| 11,942,934 B2 | 3/2024 | Ritter |
| 11,945,331 B2 | 4/2024 | Blemberg et al. |
| 11,945,522 B2 | 4/2024 | Matsumura et al. |
| 11,949,320 B2 | 4/2024 | Jaladanki et al. |
| 11,949,333 B2 | 4/2024 | Pahkala et al. |
| 11,955,896 B2 | 4/2024 | Liu et al. |
| 11,955,953 B2 | 4/2024 | Sinn et al. |
| 11,955,964 B2 | 4/2024 | Agarwal et al. |
| 11,962,234 B2 | 4/2024 | Narayanasamy et al. |
| 11,962,291 B2 | 4/2024 | Oberdieck et al. |
| 11,964,587 B2 | 4/2024 | Yukawa |
| 11,970,076 B2 | 4/2024 | Sarfert et al. |
| 11,977,404 B2 | 5/2024 | Chandrasekaran |
| 11,984,802 B2 | 5/2024 | Merkin et al. |
| 11,984,876 B2 | 5/2024 | Neidorff et al. |
| 11,990,776 B2 | 5/2024 | Dulle |
| 11,990,777 B2 | 5/2024 | Woll et al. |
| 11,996,686 B2 | 5/2024 | Chan et al. |
| 11,996,699 B2 | 5/2024 | Vasconcelos Araujo et al. |
| 11,996,714 B2 | 5/2024 | El Markhi et al. |
| 11,996,715 B2 | 5/2024 | Nandi et al. |
| 11,996,762 B2 | 5/2024 | Hembach et al. |
| 11,996,830 B2 | 5/2024 | Murthy et al. |
| 11,996,847 B1 | 5/2024 | Kazama et al. |
| 12,003,191 B2 | 6/2024 | Chaudhary et al. |
| 12,003,229 B2 | 6/2024 | Kaya et al. |
| 12,003,237 B2 | 6/2024 | Waters |
| 12,008,847 B2 | 6/2024 | Braun et al. |
| 12,009,679 B2 | 6/2024 | Gottwald et al. |
| 12,012,057 B2 | 6/2024 | Schneider et al. |
| 12,015,342 B2 | 6/2024 | Kienzler et al. |
| 12,019,112 B2 | 6/2024 | Jarmolowitz et al. |
| 12,021,517 B2 | 6/2024 | S et al. |
| 2017/0331469 A1 | 11/2017 | Kilb et al. |
| 2019/0097563 A1 | 3/2019 | Shimomugi et al. |
| 2020/0195121 A1 | 6/2020 | Keskar et al. |
| 2021/0005711 A1 | 1/2021 | Martinez-Limia et al. |
| 2021/0408950 A1 | 12/2021 | Watkins et al. |
| 2022/0052610 A1 | 2/2022 | Plum |
| 2022/0294441 A1 | 9/2022 | Purcarea et al. |
| 2023/0010616 A1 | 1/2023 | Gschwantner et al. |
| 2023/0061922 A1 | 3/2023 | Ritter |
| 2023/0082076 A1 | 3/2023 | Strache et al. |
| 2023/0126070 A1 | 4/2023 | Oberdieck et al. |
| 2023/0179198 A1 | 6/2023 | Winkler |
| 2023/0231210 A1 | 7/2023 | Joos et al. |
| 2023/0231400 A1 | 7/2023 | Oberdieck et al. |
| 2023/0231496 A1 | 7/2023 | Syed et al. |
| 2023/0238808 A1 | 7/2023 | Swoboda et al. |
| 2023/0268826 A1 | 8/2023 | Yan et al. |
| 2023/0335509 A1 | 10/2023 | Poddar |
| 2023/0365086 A1 | 11/2023 | Schumacher et al. |
| 2023/0370062 A1 | 11/2023 | Wolf |
| 2023/0378022 A1 | 11/2023 | Kim et al. |
| 2023/0386963 A1 | 11/2023 | Kim et al. |
| 2023/0402930 A1 | 12/2023 | Corry et al. |
| 2023/0420968 A1 | 12/2023 | Oner et al. |
| 2023/0421049 A1 | 12/2023 | Neidorff |
| 2024/0006869 A1 | 1/2024 | Kim et al. |
| 2024/0006899 A1 | 1/2024 | Wernerus |
| 2024/0006993 A1 | 1/2024 | Barjati et al. |
| 2024/0022187 A1 | 1/2024 | Fassnacht |
| 2024/0022240 A1 | 1/2024 | Balaz |
| 2024/0022244 A1 | 1/2024 | S et al. |
| 2024/0030730 A1 | 1/2024 | Wernerus |
| 2024/0039062 A1 | 2/2024 | Wernerus |
| 2024/0039402 A1 | 2/2024 | Bafna et al. |
| 2024/0039406 A1 | 2/2024 | Chen et al. |
| 2024/0048048 A1 | 2/2024 | Zhang |
| 2024/0055488 A1 | 2/2024 | Lee et al. |
| 2024/0067116 A1 | 2/2024 | Qiu |
| 2024/0072675 A1 | 2/2024 | Formenti et al. |
| 2024/0072817 A1 | 2/2024 | K et al. |
| 2024/0077899 A1 | 3/2024 | Chitnis et al. |
| 2024/0078204 A1 | 3/2024 | Roehrle et al. |
| 2024/0079950 A1 | 3/2024 | Narayanasamy |
| 2024/0079958 A1 | 3/2024 | Kumar et al. |
| 2024/0080028 A1 | 3/2024 | Dake et al. |
| 2024/0088647 A1 | 3/2024 | Ramadass et al. |
| 2024/0088896 A1 | 3/2024 | Bilhan et al. |
| 2024/0097437 A1 | 3/2024 | Goyal et al. |
| 2024/0097459 A1 | 3/2024 | Swoboda et al. |
| 2024/0105276 A1 | 3/2024 | Duryea |
| 2024/0106248 A1 | 3/2024 | Woll et al. |
| 2024/0106435 A1 | 3/2024 | Zhang et al. |
| 2024/0113517 A1 | 4/2024 | Sriraj et al. |
| 2024/0113611 A1 | 4/2024 | Kaufmann et al. |
| 2024/0113620 A1 | 4/2024 | Ranmuthu et al. |
| 2024/0113624 A1 | 4/2024 | Southard et al. |
| 2024/0120558 A1 | 4/2024 | Zhang et al. |
| 2024/0120765 A1 | 4/2024 | Oner et al. |
| 2024/0120962 A1 | 4/2024 | Miriyala et al. |
| 2024/0128851 A1 | 4/2024 | Ruck et al. |
| 2024/0128859 A1 | 4/2024 | Chen |
| 2024/0128867 A1 | 4/2024 | Wang et al. |
| 2024/0146177 A1 | 5/2024 | Mehdi et al. |
| 2024/0146306 A1 | 5/2024 | Ramkaj et al. |
| 2024/0149734 A1 | 5/2024 | Eisenlauer |
| 2024/0162723 A1 | 5/2024 | Zipf et al. |
| 2024/0178756 A1 | 5/2024 | El-Markhi et al. |
| 2024/0178824 A1 | 5/2024 | Kazama et al. |
| 2024/0186803 A1 | 6/2024 | Krieg et al. |
| 2024/0198937 A1 | 6/2024 | Benqassmi et al. |
| 2024/0198938 A1 | 6/2024 | Carlos et al. |
| 2024/0204540 A1 | 6/2024 | Majmunovic et al. |
| 2024/0204541 A1 | 6/2024 | Majmunovic et al. |
| 2024/0204671 A1 | 6/2024 | Liu et al. |
| 2024/0204765 A1 | 6/2024 | Dake |
| 2024/0213874 A1 | 6/2024 | Junnarkar et al. |
| 2024/0213971 A1 | 6/2024 | Lee |

(56) References Cited

U.S. PATENT DOCUMENTS

| | | |
|---|---|---|
| 2024/0213975 A1 | 6/2024 | Narayanasamy |
| 2024/0213981 A1 | 6/2024 | Agarwal et al. |

FOREIGN PATENT DOCUMENTS

| | | | |
|---|---|---|---|
| WO | 2007093598 A1 | 8/2007 | |
| WO | 2013054413 A1 | 4/2013 | |
| WO | 2014135209 A1 | 9/2014 | |
| WO | 2019034505 A1 | 2/2019 | |
| WO | 2020156820 A1 | 8/2020 | |
| WO | 2020239797 A1 | 12/2020 | |
| WO | 2021110405 A1 | 6/2021 | |
| WO | 2021213728 A1 | 10/2021 | |
| WO | 2022012943 A1 | 1/2022 | |
| WO | 2022229149 A1 | 11/2022 | |
| WO | 2023006491 A1 | 2/2023 | |
| WO | 2023046607 A1 | 3/2023 | |
| WO | 2023094053 A1 | 6/2023 | |
| WO | 2023110991 A1 | 6/2023 | |
| WO | 2023147907 A1 | 8/2023 | |
| WO | 2023151850 A1 | 8/2023 | |
| WO | 2023227278 A1 | 11/2023 | |
| WO | 2023237248 A1 | 12/2023 | |
| WO | 2024006181 A2 | 1/2024 | |
| WO | 2024012743 A1 | 1/2024 | |
| WO | 2024012744 A1 | 1/2024 | |
| WO | 2024022219 A1 | 2/2024 | |
| WO | 2024041776 A1 | 2/2024 | |
| WO | 2024046614 A1 | 3/2024 | |
| WO | 2024049730 A1 | 3/2024 | |
| WO | 2024049884 A1 | 3/2024 | |
| WO | 2024049909 A1 | 3/2024 | |
| WO | 2024056388 A1 | 3/2024 | |
| WO | 2024068065 A1 | 4/2024 | |
| WO | 2024068076 A1 | 4/2024 | |
| WO | 2024068113 A1 | 4/2024 | |
| WO | 2024068115 A1 | 4/2024 | |
| WO | 2024083391 A1 | 4/2024 | |
| WO | 2024093384 A1 | 5/2024 | |
| WO | 2024104970 A1 | 5/2024 | |
| WO | 2024108401 A1 | 5/2024 | |
| WO | 2024110106 A1 | 5/2024 | |
| WO | 2024110265 A1 | 5/2024 | |
| WO | 2024110297 A1 | 5/2024 | |
| WO | 2024114978 A1 | 6/2024 | |
| WO | 2024114979 A1 | 6/2024 | |
| WO | 2024114980 A1 | 6/2024 | |
| WO | 2024128286 A1 | 6/2024 | |
| WO | 2024132249 A1 | 6/2024 | |

OTHER PUBLICATIONS

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

Balogh, L., "Fundamentals of MOSFET and IGBT Gate Driver Circuits," Texas Instruments Application Report, SLUA618-Mar. 2017, Retrieved from internet URL: https://ghioni.faculty.polimi.it/pel/readmat/gate-drive.pdf, 65 pages.

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068&ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC-E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/ieee/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

SYSTEMS AND METHODS FOR INTEGRATED GATE DRIVER FOR INVERTER FOR ELECTRIC VEHICLE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377,501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to systems and methods for an integrated gate driver for an inverter for an electric vehicle, and, more particularly, to systems and methods for an integrated gate driver for power device switches for an inverter for an electric vehicle.

BACKGROUND

Inverters, such as those used to drive a motor in an electric vehicle, for example, are responsible for converting High Voltage Direct Current (HVDC) into Alternating Current (AC) to drive the motor. In an inverter, a gate driver for a power device switch may operate in a high voltage and electrically noisy environment, which may affect an operation of the gate driver and/or power device switches, and therefore may affect an operation of the inverter.

The present disclosure is directed to overcoming one or more of these above-referenced challenges.

SUMMARY OF THE DISCLOSURE

In some aspects, the techniques described herein relate to a system including: an inverter configured to convert DC power from a battery to AC power to drive a motor, wherein the inverter includes: a first power module including: a first connection; a second connection; a first power switch including a first gate terminal, the first power switch configured to control a first flow of current between the first connection and the second connection based on a first signal to the first gate terminal; and a first point-of-use controller configured to provide the first signal to the first gate terminal to control the first power switch.

In some aspects, the techniques described herein relate to a system, wherein the first power module further includes: a third connection; a second power switch including a second gate terminal, the second power switch configured to control a second flow of current between the third connection and the second connection based on a second signal to the second gate terminal; and a second point-of-use controller configured to provide the second signal to the second gate terminal to control the second power switch.

In some aspects, the techniques described herein relate to a system, wherein the first connection is configured to be connected to a positive terminal of the battery, the second connection is configured to be connected to a phase terminal of the motor, and the third connection is configured to be connected to a negative terminal of the battery.

In some aspects, the techniques described herein relate to a system, wherein the first power module further includes: a command pin, wherein the first point-of-use controller is further configured to receive a gate command via the command pin, and provide the first signal to the first gate terminal, based on the received gate command.

In some aspects, the techniques described herein relate to a system, wherein the first power switch includes one or more silicon carbide dies.

In some aspects, the techniques described herein relate to a system, wherein the first point-of-use controller includes a first gate drive controller and a second gate drive controller.

In some aspects, the techniques described herein relate to a system, wherein the inverter further includes: a second power module; and a third power module.

In some aspects, the techniques described herein relate to a system, further including: the battery configured to supply the DC power to the inverter; and the motor configured to receive the AC power from the inverter to drive the motor.

In some aspects, the techniques described herein relate to a system including: a power module for an inverter for an electric vehicle, the power module including: a first connection; a second connection; a first power switch including a first gate terminal, the first power switch configured to control a first flow of current between the first connection and the second connection based on a first signal to the first gate terminal; and a first point-of-use controller configured to provide the first signal to the first gate terminal to control the first power switch.

In some aspects, the techniques described herein relate to a system, wherein the power module further includes: a third connection; a second power switch including a second gate terminal, the second power switch configured to control a second flow of current between the third connection and the second connection based on a second signal to the second gate terminal; and a second point-of-use controller configured to provide the second signal to the second gate terminal to control the second power switch.

In some aspects, the techniques described herein relate to a system, wherein the first connection is configured to be connected to a positive terminal of a battery of the electric vehicle, the second connection is configured to be connected to a phase terminal of a motor of the electric vehicle, and the third connection is configured to be connected to a negative terminal of the battery.

In some aspects, the techniques described herein relate to a system, wherein the power module further includes: a command pin, wherein the first point-of-use controller is further configured to receive a gate command via the command pin, and provide the first signal to the first gate terminal, based on the received gate command.

In some aspects, the techniques described herein relate to a system, wherein the first power switch includes one or more silicon carbide dies.

In some aspects, the techniques described herein relate to a system, wherein the first point-of-use controller includes a first gate drive controller and a second gate drive controller.

In some aspects, the techniques described herein relate to a system including: a point-of-use controller for a power module for an inverter, the point-of-use controller configured to: receive a gate command; and generate a signal for a gate terminal of a power switch of the power module, based on the received gate command.

In some aspects, the techniques described herein relate to a system, wherein the point-of-use controller is further configured to: receive a sensing signal from the power switch; and generate the signal for the gate terminal based on the received sensing signal.

In some aspects, the techniques described herein relate to a system, wherein the point-of-use controller is further configured to: control a current through the power switch using the signal for the gate terminal.

In some aspects, the techniques described herein relate to a system, wherein the point-of-use controller is further configured to: sense a gate-to-source voltage of the power switch during one or more of a turn-on event of the power switch or a turn-off event of the power switch.

In some aspects, the techniques described herein relate to a system, wherein the point-of-use controller is further configured to generate the signal for the gate terminal based on one or more of a variation in intrinsic parameters of the power switch, a parameter drift over a life of the power switch, or an operating temperature of the power switch.

In some aspects, the techniques described herein relate to a system, wherein the point-of-use controller is configured to control a first group of silicon carbide dies of the power switch and to control a second group of silicon carbide dies of the power switch independently from the first group.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
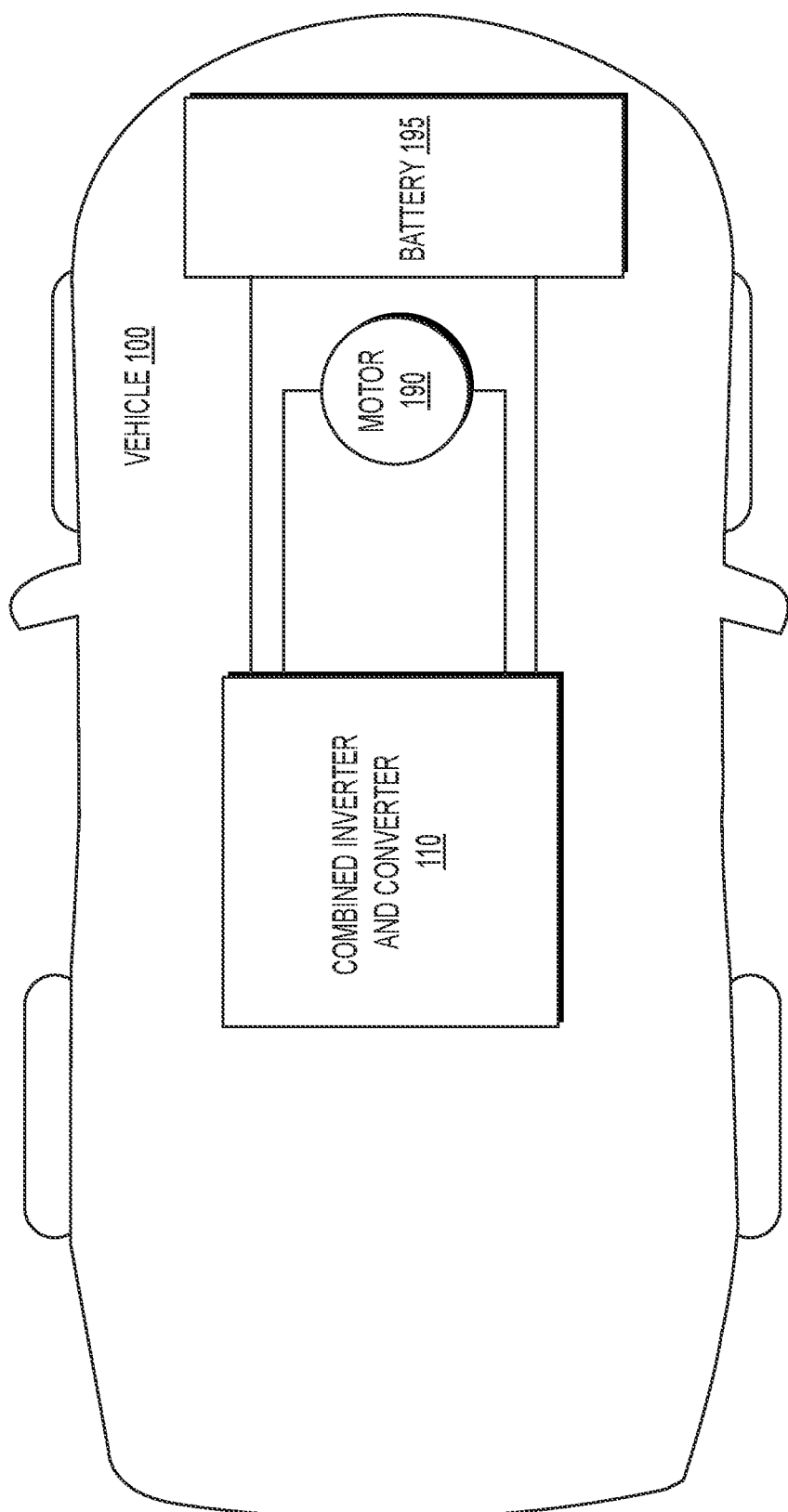
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to systems and methods for an integrated gate driver for an inverter for an electric vehicle, and, more particularly, to systems and methods for an integrated gate driver for power device switches for an inverter for an electric vehicle. However, the disclosure is not limited thereto. For example, the integrated gate driver may be used in any power electronics application that changes AC to DC, DC to AC, or DC to DC. For example, the inverter may be used in a windmill application, solar application, an application that returns power to an AC grid, or an application that drives an AC motor.

Inverters, such as those used to drive a motor in an electric vehicle, for example, are responsible for converting High Voltage Direct Current (HVDC) into Alternating Current (AC) to drive the motor. A three phase inverter may include a bridge with six power device switches (for example, power transistors such as IGBT or MOSFET) that are controlled by Pulse Width Modulation (PWM) signals generated by a controller. An inverter may include three half-H bridge switches to control the phase voltage, upper and lower gate drivers to control the switches, a PWM controller, and glue logic between the PWM controller and the gate drivers. The PWM controller may generate signals to define the intended states of the system. The gate drivers may send the signals from the PWM controller to the half-H bridge switches. The half-H bridge switches may drive the phase voltage. The inverter may include an isolation barrier between low voltage and high voltage planes. Signals may pass from the PWM controller to the half-H bridge switches by passing across the isolation barrier, which may employ optical, transformer-based, or capacitance-based isolation. PWM signals may be distorted when passing through the glue logic, which may include resistive, capacitive, or other types of filtering. PWM signals may be distorted when passing through the gate driver, due to the galvanic isolation barrier and other delays within the gate driver. PWM signals may be distorted when the signals processed by the half-H switch via the gate driver output.

Gate drivers may tolerate common-mode transients that occur during field-effect transistor (FET) switching and when one side of the floating high voltage terminal is shorted to ground or subject to an electro-static discharge. These voltage transients may result in fast edges, which may create bursts of common-mode current through the galvanic isolation. A gate driver may need to demonstrate common-mode transient immunity (CMTI) in order to be effective and safe.

Gate drivers may have a high-voltage domain in common to the voltage plane of an associated FET. Further, high-voltage planes may be supplied by a flyback converter that may be isolated through a transformer from the low-voltage plane. The high-voltage domain supply may be used to power circuits which source and sink gate current to drive the FET and which may detect FET faults so the faults can be acted upon and/or communicated to the low-voltage domain. Gate drivers may include a galvanic channel dedicated to FET commands, and one or more bidirectional or unidirectional galvanic channels dedicated to FET communications.

High current switching transients may create strong electro-magnetic (EM) fields that may couple into nearby metal traces. The magnitude and frequency of coupled currents may depend upon the layout of the FET packaging solution and the direction and length of metal traces between the FET and the control integrated circuit (IC). For example, typical values for coupled currents may be up to 1 A at AC frequencies up to 100 MHz. Typically, within a circuit, the gate driver IC may be placed far enough away from the FET that high EM fields do not couple directly into the internal metal traces within the gate driver IC. The gate driver is placed a distance from EM fields such that induced currents within the circuitry are below levels that will cause malfunction of the gate driver, or a metal shield is placed between the gate driver and the source of EM fields to protect the gate driver circuitry. The output terminals of the gate driver that connect to the FET are exposed to the EM fields at the point where the output terminals are no longer covered by a shield. The gate driver switches large currents (such as 5A to 15A, for example) through these exposed terminals. The switched large currents are generally greater in magnitude than the EM-induced currents. The gate driver is able to overdrive the induced currents to maintain control of the FETs. The high side of the gate driver and the associated FET may share a common ground and a gate control signal trace, both of which may be susceptible to coupled currents.

Gate drivers may turn on low-resistance switches to source and sink gate currents. Series resistors may sometimes be added to limit gate current. Switched gate currents may be larger than coupled currents in order to maintain control of their respective FETs.

Gate drivers may be able to sense FET operating voltages or currents in order to provide feedback and react to faults. Over-current faults may typically be detected by sensing the FET drain to source voltage and comparing the sensed voltage to a reference value. This drain to source voltage sensing may be DSAT, which refers to desaturation of the power switch, which creates a voltage drop. Though over currents do create larger voltage drops across the Rdson of an enhanced power switch, DSAT is typically referred to as voltage fault detection, as opposed to current fault detection that is sensed by monitoring the voltage across a shunt resistance. Sensed voltages may be heavily filtered to reject coupled currents. Filtering may slow down the response to fault conditions, resulting in delays in response. For example, the rate of current increase due to a low resistance short circuit may reach damaging levels prior to being detected by the heavily filtered drain to source voltage detection strategy. The resulting short circuit may damage the FET or the vehicle, prior to being detected and shut off.

According to one or more embodiments, a FET driver circuit may provide rapid over-current detection by either shunt current sensing or by diverting a fraction of the load current through a parallel FET that may have a current sensing circuit. Utilizing either strategy may require a "point-of-use IC" where sensing circuitry is in close proximity to the FET. Even if a point-of-use IC and a remote controller are resistant to EM fields, communication between the point-of-use IC and remote controller remains susceptible to induced currents. Point-of-use ICs have been implemented in low EM field applications, such as smart FETs for automotive applications. However, point-of-use ICs have not been used in high EM field applications. A high EM field may be a field (i) that induces a current within an IC that is in excess of an operating current of the IC and leads to malfunction, or (ii) that induces a differential voltage within an IC which is in excess of the operating differential voltage and leads to malfunction. A high EM field may be a field that is greater than approximately 10 A or approximately 100V, for example. Some traction inverter applications may have high voltages in the range of 800V and current levels approaching 1000 A. Switching rates of signals containing these voltages and currents may approach 20V/ns and 20 A/ns, and may enable coupling that is problematic for controllers that control these voltages and currents.

Isolated gate drivers may include two or more integrated circuits (ICs) in a single package. The isolation may be made available in in wide body "Small Outline Package" where one side of the gate driver is in the low voltage domain and one side of the gate driver is in the high voltage domain, which allows the isolated gate driver to straddle the separation imposed by the low voltage and high voltage domains on a circuit board. Because these gate drivers may be implemented by two or more integrated circuits, they may be called a multi-chip module. A low voltage IC (LVIC) may interface to circuitry referenced to a ground in a low voltage domain, and other ICs, such as high voltage IC (HVIC), may interface to circuitry referenced to one or more high voltage domains. Some isolated gate drivers may include one LVIC and one or two HVICs. Internal wire bonds may connect the LVIC and HVIC within the package. These internal wire bonds may connect to a high voltage element, such as a transformer or capacitor, on one or both of the LVIC and HVIC, to create galvanic isolation between the low voltage domain and the high voltage domain. AC signals are passed through this high voltage element to provide a communication pathway between the low voltage domain and the high voltage domain. This communication pathway provides the galvanic isolation required as a safety element of the system.

Some systems have one isolated gate driver per power switch, and the isolated gate driver is remote from the power module. Some power switches include silicon carbide (SiC) FETs, and the isolated gate drivers are located remotely from the SiC FETs in the power switch. Isolated gate drivers may not include shunt current sensing because a differential voltage drop across a source plane of a power switch can only be sensed with precision and short delay if the loop of the sensing circuit is quite small. External sensing of this signal may not achieve a desired response time. During a fault, a gate driver may enter a soft shutdown of the power switch during a turn-on operation to reduce the current in the parasitic inductances, and as a result, reduce the over voltages produced by these currents. Here, "isolated" and "remote" may refer to any device external to the power module. The routing from the isolated gate driver to the power switch may make sensing the gate-to source voltage of the SiC FETs accurately during turn-on and turn-off events of the SiC FETs difficult, due to parasitic inductance in the gate and source traces, which results in induced voltages across the gate and source traces. A gate driver at a point-of-use on the power module may directly access voltages available within the power switch. Remote mounted gate drivers may receive a distorted signal because the return currents to the gate driver may be distorted by the voltage drop across the parasitic impedance of the routing to the gate driver. Some isolated gate drivers measure a power switch temperature remotely by using a sensor, such as a diode or thermistor, onboard the power switch. This sensor itself may provide a point temperature measurement that may differ from an actual SiC temperature by a substantial margin, with further error caused by noise incurred by long traces or lead length from the sensor to the isolated gate driver. In an isolated gate driver system, a desaturation circuit may provide short circuit protection by sensing when a voltage across the power switch is too large after the SiC FET has been fully enhanced. Desaturation, when applied to a MOSFET power device, may refer to when the device is current limited by the voltage at the gate such that the drain voltage cannot pull down to a level where the conductive power loss is only due to the Rdson of the device. This increase in drain to source voltage may be sensed through a diode, where the cathode is attached to the drain and the anode is attached to the sensing circuit within the gate driver. Because the sensing circuit is switched by the drain to source voltage, the sensing circuit may require decoupling capacitance. However, added capacitance to the sensing circuit forces some delay in turning off the power device during a short circuit event. This delay time, the higher than normal drain to source voltage, and the high currents, may stress the power device. This short circuit protection may result in large current and/or temperature transients within the SiC die, which may stress the SiC die. This short circuit protection may require significant external components to protect and bias drain sensing circuitry of the isolated gate driver. The DSAT circuit typically uses a diode string, where one diode cathode is driven by the MOSFET drain. The diode string or number of diodes may be determined by system voltage and transient voltage expected at the drain. The most significant parameter for these diodes, other than the stand-off voltage, is the capacitance of the diodes. The DSAT circuit may also require a decoupling capacitor and a series resistor. Here, "significant external components" may refer to an area required by the physical size of the components. Gate drivers that use one LVIC with two HVICs to drive one half-H element (both upper and lower phases) may compromise system safety, as both an upper driver and lower driver may be compromised in a failure event.

One or more embodiments may integrate a gate driver into the power switch, as an integrated gate driver or point-of-use controller. The integrated gate driver may be an application-specific integrated circuit (ASIC), for example. A phase switch power module that includes two switches may incorporate two integrated gate drivers, with a gate driver for each switch. One or more embodiments may locally sense current of a SiC die by sensing a voltage drop across the source metallization. One or more embodiments may include local precision thermal sensing of the SiC die and an environment of the SiC die, without the need for integrated on die temperature sense circuitry, which may provide improved die thermal performance or lower die cost. One or more embodiments may closely couple gate drive circuitry to the SiC bare die that makes up the power switch, which may reduce switching losses. One or more embodiments may include a gate drive profile as a function of one or more of SiC FET gate-to-source voltage, temperature, or known gate-to-source voltage thresholds that may change over the life of the SiC FET. One or more embodiments may measure and store specific SiC device characteristics in a memory, such as an EEPROM, for example, of the integrated gate driver, and may provide custom tailored gate drive profiles based on the stored SiC device characteristics. One or more embodiments may use a two-wire bus for communication, which may reduce a number of connections to a galvanic isolated device. One or more embodiments may provide a three HVIC to one LVIC using a first multi-chip module for upper switches of a three-phase bridge and a second multi-chip module for lower switches of a three-phase bridge.

One or more embodiments may provide direct current sensing, which may provide less stress on SiC devices in the event of a short circuit event. As the gain on the SiC devices are quite high relative to BJTs and IGBTs, the currents achieved during a short circuit event have increased. DSAT, as a sensing technique, depends on the power device not being able to achieve a faulted current level and exhibit a greater than normal voltage drop across the power device. One or more embodiments may provide a low delay circuit that detects the change in current as the power device is switched into a short circuit, where the values may be four times the normal current, and may turn off the power device as the current begins to rise, at the switching event. The faster response may reduce current and energy stored in the parasitic inductance, and reduce overvoltage, and therefore, stress on the power device. One or more embodiments may provide precise temperature measurement, which may allow operation at a higher average temperature for system optimization. One or more embodiments may reduce switching losses due to one or more of a tightly coupled layout of the point-of-use controller on the power module with the power device, usage of SiC device characteristics, usage of temperature, and usage of previous cycle current. Reduced switching losses may provide an increased range for an electric vehicle. Reduced switching losses may provide a higher current output of the power switch or module. One or more embodiments may provide safety independence as required in permanent magnet machines for active short circuit discharge during device failure.

FIG. 1 depicts an exemplary system infrastructure for a vehicle including a combined inverter and converter, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
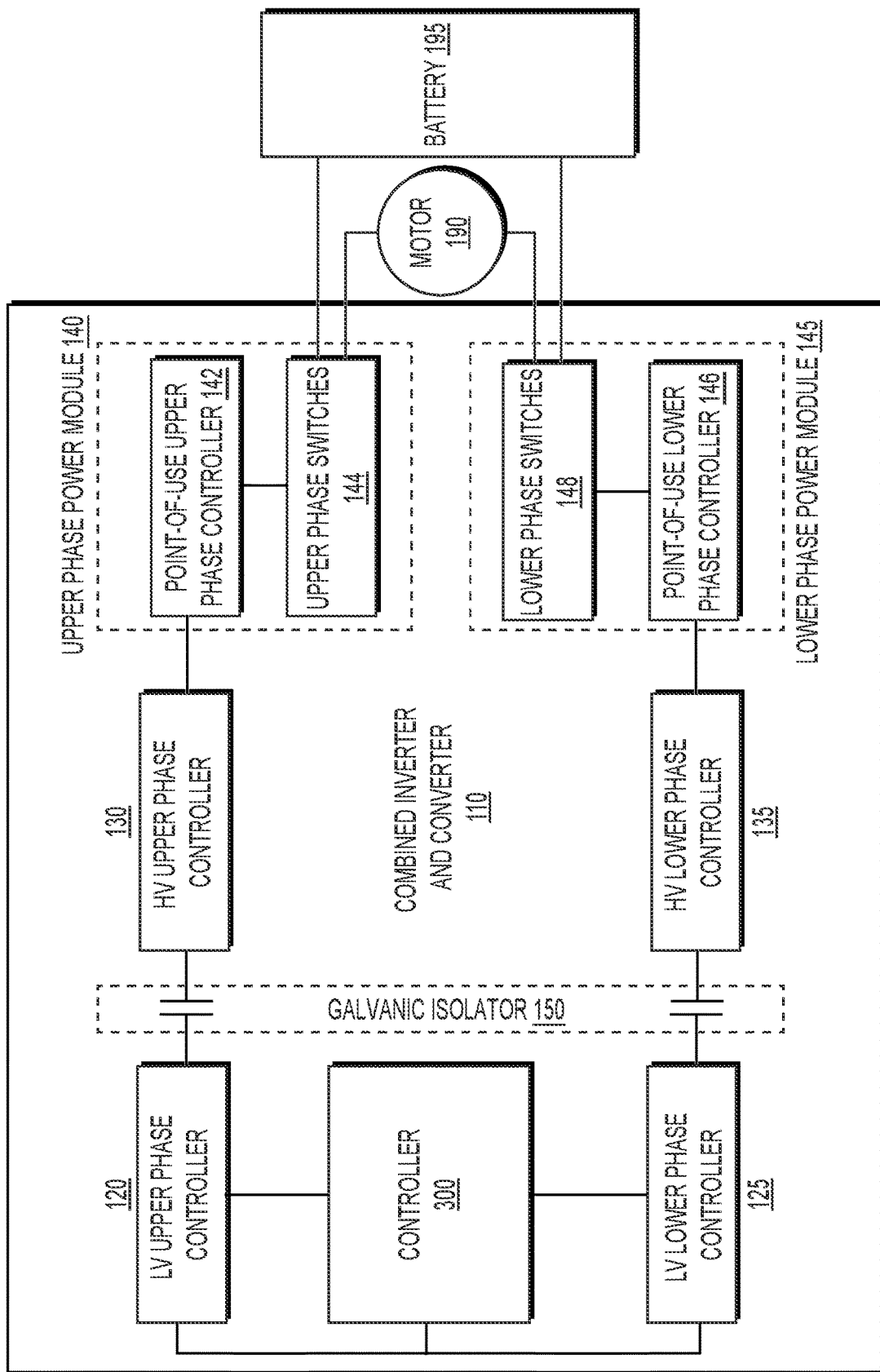
FIG. 2 depicts an exemplary system infrastructure for the combined inverter and converter of FIG. 1 with a point-of-use switch controller, according to one or more embodiments.

FIG. 2 depicts an exemplary system infrastructure for the inverter 110 of FIG. 1 with a point-of-use switch controller, according to one or more embodiments. Electric vehicle 100 may include inverter 110, motor 190, and battery 195. Inverter 110 may include an inverter controller 300 (shown in FIG. 3) to control the inverter 110. Inverter 110 may include a low voltage upper phase controller 120 separated from a high voltage upper phase controller 130 by a galvanic isolator 150, and an upper phase power module 140. Upper phase power module 140 may include a point-of-use upper phase controller 142 and upper phase switches 144. Inverter 110 may include a low voltage lower phase controller 125 separated from a high voltage lower phase controller 135 by galvanic isolator 150, and a lower phase power module 145. Lower phase power module 145 may include a point-of-use lower phase controller 146 and lower phase switches 148. Upper phase switches 144 and lower phase switches 148 may be connected to motor 190 and battery 195. Galvanic isolator 150 may be one or more of optical, transformer-based, or capacitance-based isolation. Galvanic isolator 150 may be one or more capacitors with a value from approximately 20 fF to approximately 100 fF, with a breakdown voltage from approximately 6 kV to approximately 12 kV, for example. Galvanic isolator 150 may include a pair of capacitors, where one capacitor of the pair carries an inverse data signal from the other capacitor of the pair to create a differential signal for common-mode noise rejection. Galvanic isolator 150 may include more than one capacitor in series. Galvanic isolator 150 may include one capacitor located on a first IC, or may include a first capacitor located on a first IC and a second capacitor located on a second IC that communicates with the first IC.

Inverter 110 may include a low voltage area, where voltages are generally less than 5V, for example, and a high voltage area, where voltages may exceed 500V, for example. The low voltage area may be separated from the high voltage area by galvanic isolator 150. Inverter controller 300 may be in the low voltage area of inverter 110, and may send signals to and receive signals from low voltage upper phase controller 120. Low voltage upper phase controller 120 may be in the low voltage area of inverter 110, and may send signals to and receive signals from high voltage upper phase controller 130. Low voltage upper phase controller 120 may send signals to and receive signals from low voltage lower phase controller 125. High voltage upper phase controller 130 may be in the high voltage area of inverter 110. Accordingly, signals between low voltage upper phase controller 120 and high voltage upper phase controller 130 pass through galvanic isolator 150. High voltage upper phase controller 130 may send signals to and receive signals from point-of-use upper phase controller 142 in upper phase power module 140. Point-of-use upper phase controller 142 may send signals to and receive signals from upper phase switches 144. Upper phase switches 144 may be connected to motor 190 and battery 195. Upper phase switches 144 and lower phase switches 148 may be used to transfer energy from motor 190 to battery 195, from battery 195 to motor 190, from an external source to battery 195, or from battery 195 to an external source, for example. The lower phase system of inverter 110 may be similar to the upper phase system as described above.

Figure 3:
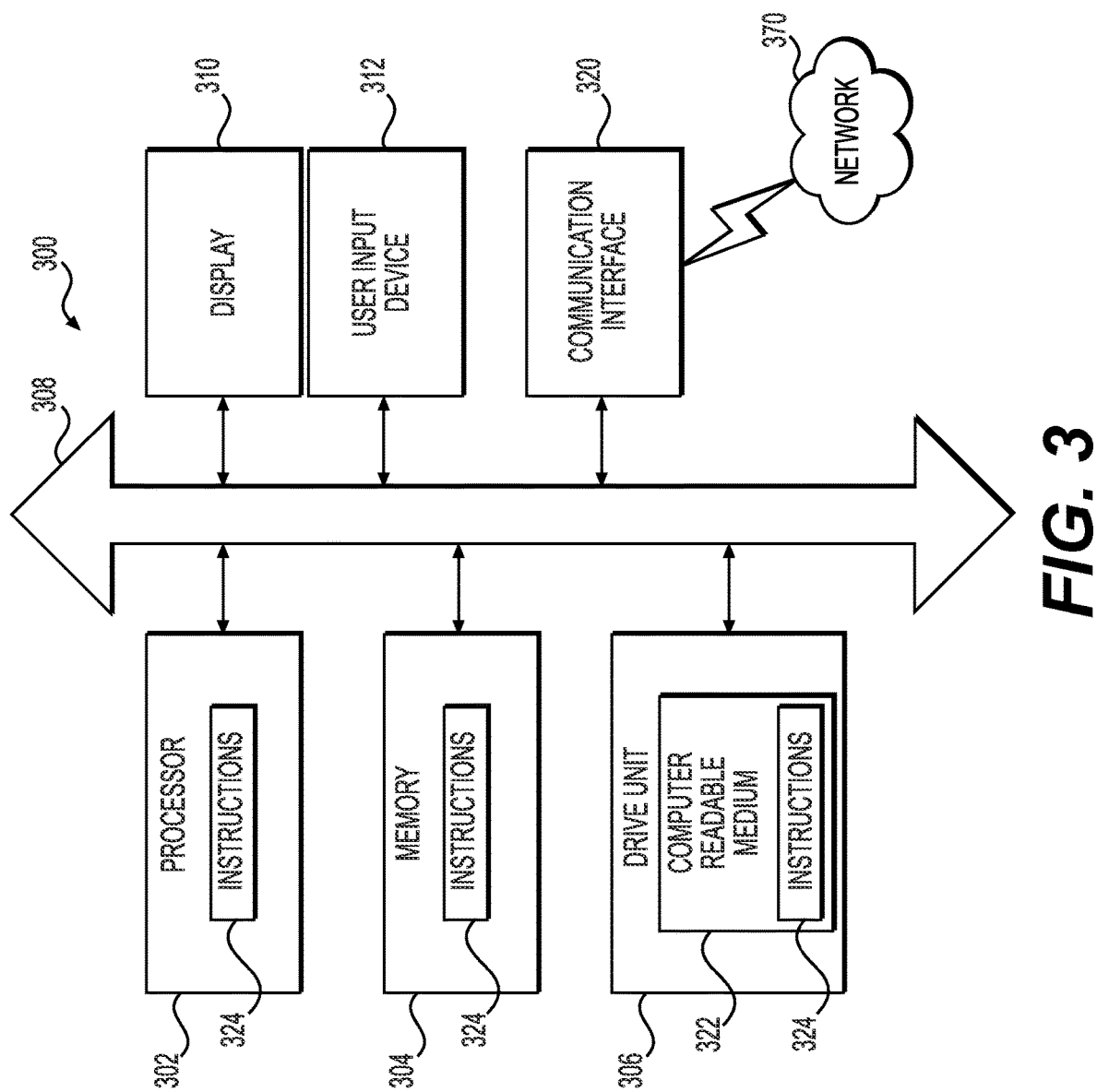
FIG. 3 depicts an exemplary system infrastructure for the controller of FIG. 2, according to one or more embodiments.

FIG. 3 depicts an exemplary system infrastructure for inverter controller 300 of FIG. 2, according to one or more embodiments. Inverter controller 300 may include one or more controllers.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
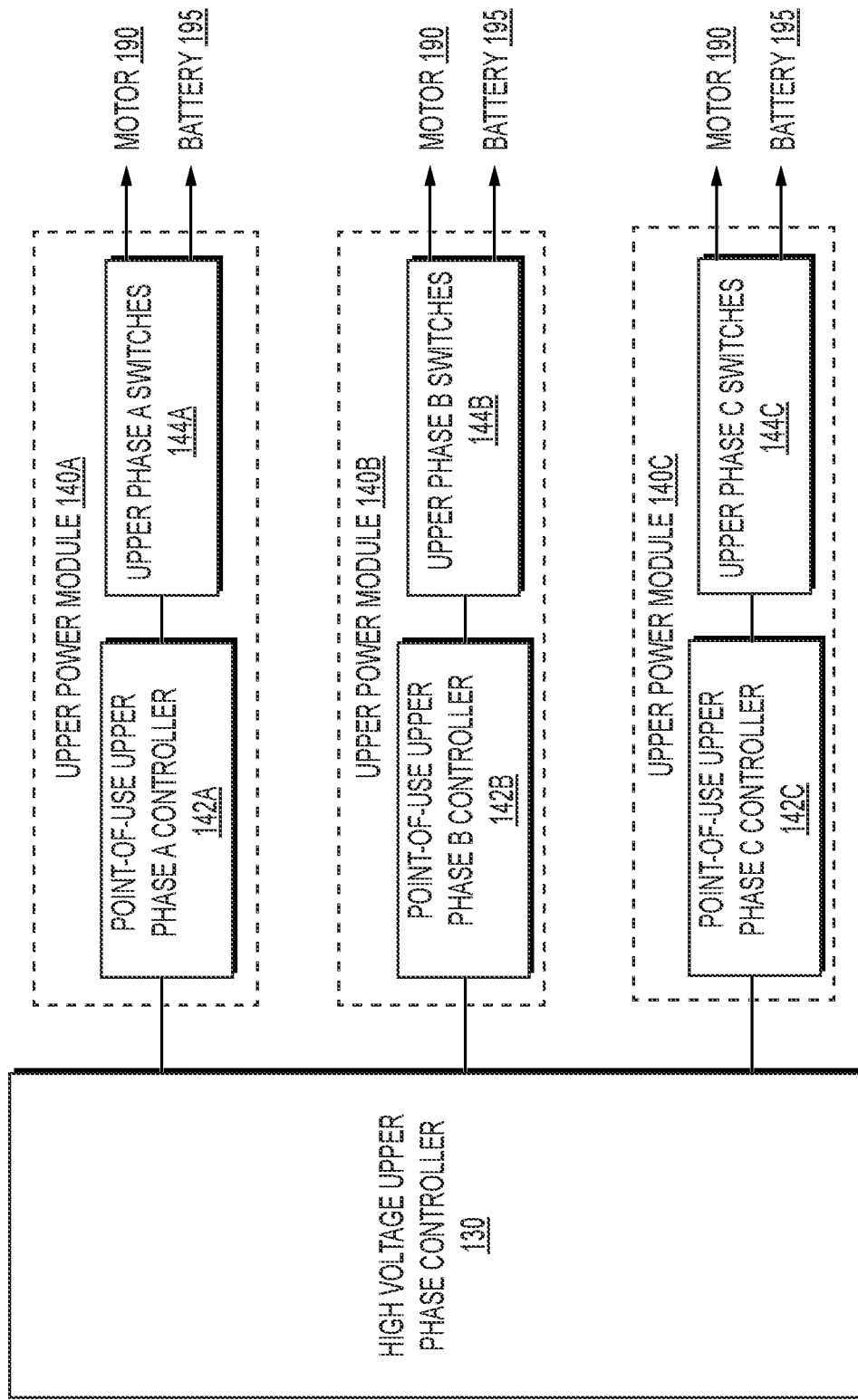
FIG. 4 depicts an exemplary system infrastructure for the point-of-use switch controller of FIG. 2, according to one or more embodiments.

FIG. 4 depicts an exemplary system infrastructure for the point-of-use switch controller of FIG. 2, according to one or more embodiments. For a three-phase inverter, each of the upper phase and the lower phase may include three phases denoted as phases A, B, and C. For example, upper phase power module 140 may include upper phase power module 140A for upper phase A, upper phase power module 140B for upper phase B, and upper phase power module 140C for upper phase C. Upper phase power module 140A may include point-of-use upper phase A controller 142A and upper phase A switches 144A. Upper phase power module 140B may include point-of-use upper phase B controller 142B and upper phase B switches 144B. Upper phase power module 140C may include point-of-use upper phase C controller 142C and upper phase C switches 144C. Each of the upper phase A switches 144A, upper phase B switches 144B, and upper phase C switches 144C may be connected to motor 190 and battery 195. FIG. 4 depicts details of the upper phase power module 140. Although not shown, the lower phase power module 145 may include a similar structure as the upper phase power module 140 for lower phases A, B, and C.

Figure 5:
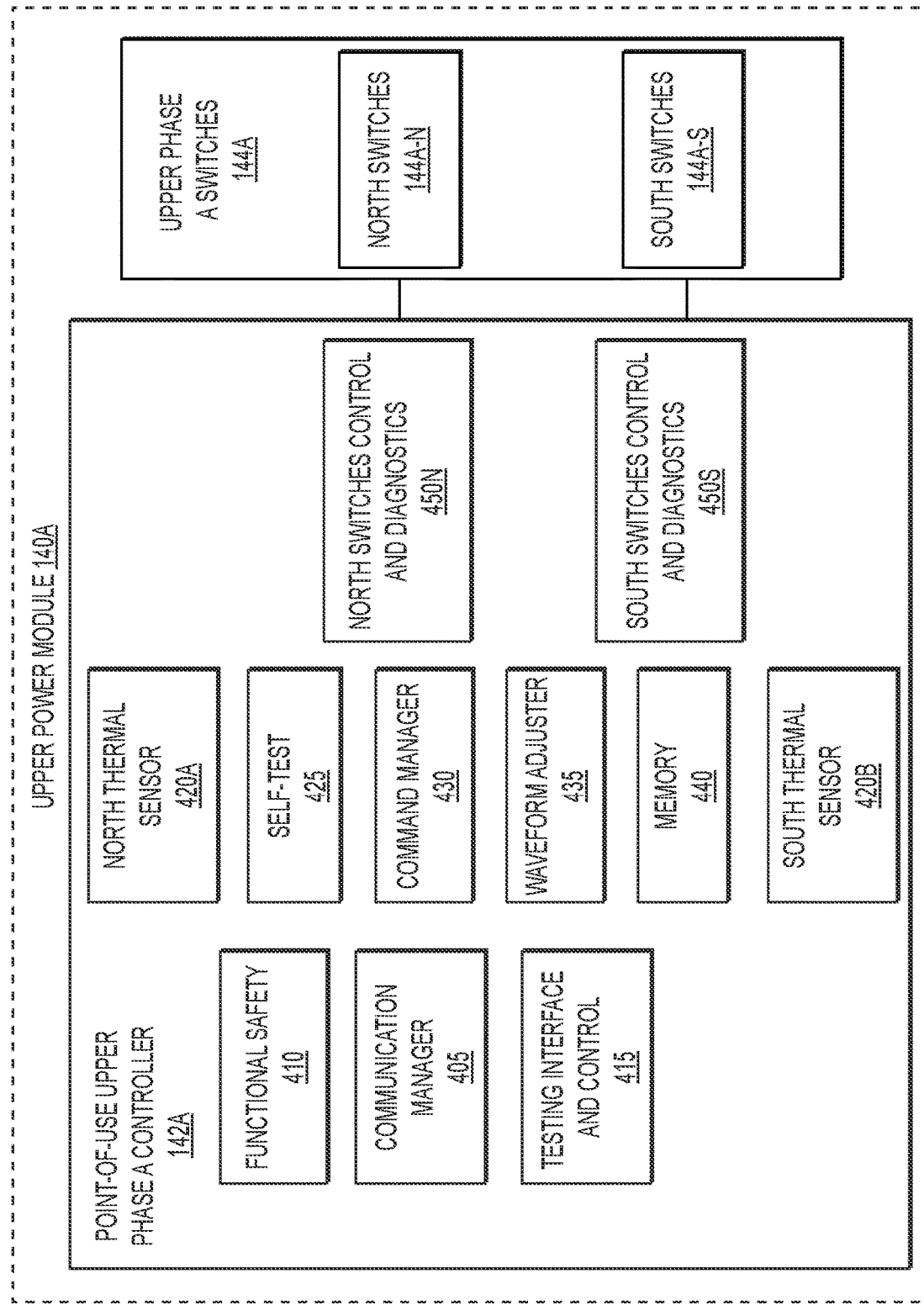
FIG. 5 depicts an exemplary system infrastructure for the upper power module of FIG. 4, according to one or more embodiments.

FIG. 5 depicts an exemplary system infrastructure for the upper power module of FIG. 4, according to one or more embodiments. For example, FIG. 5 provides additional details of upper phase power module 140A. Although not shown, upper phase power module 140B, upper phase power module 140C, and respective lower phase power modules of lower phase power module 145 may include a similar structure as the upper phase power module 140A shown in FIG. 5. Moreover, the terms upper, lower, north, and south used in the disclosure are merely for reference, do not limit the elements to a particular orientation, and are generally interchangeable throughout. For example, the upper phase power module 140 could be referred to a lower phase power module, a north phase power module, a south phase power module, a first phase power module, or a second phase power module.

Upper phase power module 140A may include point-of-use upper phase A controller 142A and upper phase A switches 144A. Upper phase A switches 144A may include one or more groups of switches. As shown in FIG. 5, upper phase A switches 144A may include upper phase A north switches 144A-N and upper phase A south switches 144A-S. Point-of-use upper phase A controller 142A may include one or more memories, controllers, or sensors. For example, point-of-use upper phase A controller 142A may include a communication manager 405, a functional safety controller 410, a testing interface and controller 415, a north thermal sensor 420A, a south thermal sensor 420B, a self-test controller 425, a command manager 430, a waveform adjuster 435, a memory 440, north switches control and diagnostics controller 450N, and south switches control and diagnostics controller 450S. Point-of-use upper phase A controller 142A may include more or less components than those shown in FIG. 5. For example, point-of-use upper phase A controller 142A may include more or less than two switch control and diagnostics controllers, and may include more than two thermal sensors.

Communication manager 405 may control inter-controller communications to and from point-of-use upper phase A controller 142A and/or may control intra-controller communications between components of point-of-use upper phase A controller 142A. Functional safety controller 410 may control safety functions of point-of-use upper phase A controller 142A. Testing interface and controller 415 may control testing functions of point-of-use upper phase A controller 142A, such as end-of-line testing in manufacturing, for example. North thermal sensor 420A may sense a temperature at a first location in point-of-use upper phase A controller 142A, and south thermal sensor 420B may sense a temperature at a second location in point-of-use upper phase A controller 142A. Self-test controller 425 may control a self-test function of point-of-use upper phase A controller 142A, such as during an initialization of the point-of-use upper phase A controller 142A following a power on event of inverter 110, for example. Command manager 430 may control commands received from communication manager 405 issued to the north switches control and diagnostics controller 450N and south switches control and diagnostics controller 450S. Waveform adjuster 435 may control a waveform timing and shape of commands received from communication manager 405 issued to the north switches control and diagnostics controller 450N and south switches control and diagnostics controller 450S. Memory 440 may include one or more volatile and non-volatile storage media for operation of point-of-use upper phase A controller 142A. North switches control and diagnostics controller 450N may send one or more signals to north switches 144A-N to control an operation of north switches 144A-N, and may receive one or more signals from north switches 144A-N that provide information about north switches 144A-N. South switches control and diagnostics controller 450S may send one or more signals to south switches 144A-S to control an operation of south switches 144A-S, and may receive one or more signals from south switches 144A-S that provide information about south switches 144A-S. As stated above, the terms north and south are merely used for reference, and north switches control and diagnostics controller 450N may send one or more signals to south switches 144A-S, and south switches control and diagnostics controller 450S may send one or more signals to south switches 144A-N.

Figure 6:
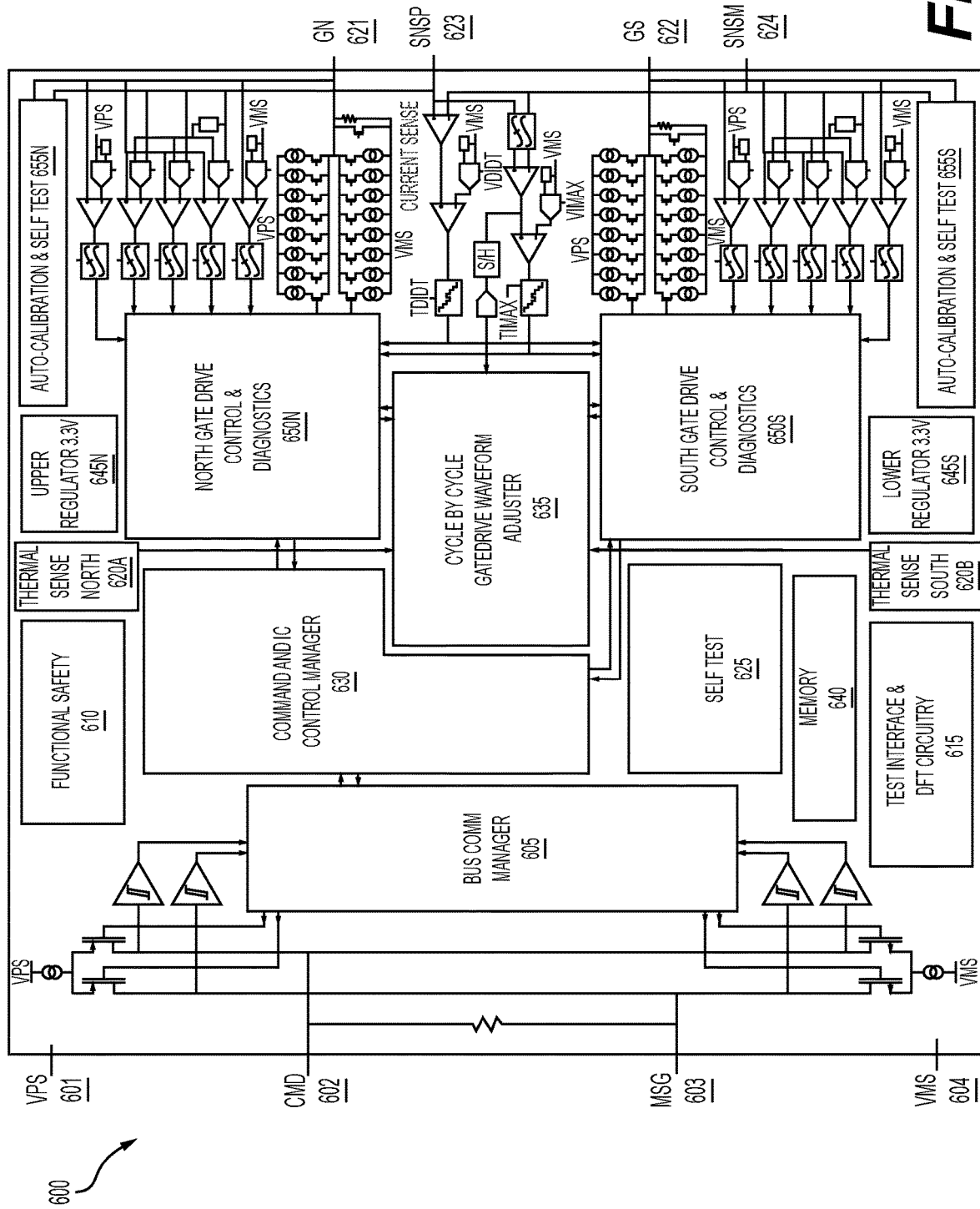
FIG. 6 depicts an exemplary block diagram for an integrated gate driver, according to one or more embodiments.

FIG. 6 depicts an exemplary block diagram for an integrated gate driver 600, according to one or more embodiments. Integrated gate driver 600 may be similar to point-of-use upper phase A controller 142A, for example. Integrated gate driver 600 may include one or more memories, controllers, or sensors. For example, integrated gate driver 600 may include a communication manager 605, a functional safety controller 610, a testing interface and controller 615, a north thermal sensor 620A, a south thermal sensor 620B, a self-test controller 625, a command manager 630, a waveform adjuster 635, a memory 640, upper regulator 645N, lower regulator 645S, north switches control and diagnostics controller 650N, south switches control and diagnostics controller 650S, upper auto-calibrator 655N, and lower auto-calibrator 655S. Integrated gate driver 600 may include more or less components than those shown in FIG. 6. For example, integrated gate driver 600 may include more or less than two switch control and diagnostics controllers, and may include more than two thermal sensors.

Communication manager 605 may control inter-controller communications to and from integrated gate driver 600 and/or may control intra-controller communications between components of integrated gate driver 600. Functional safety controller 610 may control safety functions of integrated gate driver 600. Testing interface and controller 615 may control testing functions of integrated gate driver 600, such as end-of-line testing in manufacturing, for example. North thermal sensor 620A may sense a temperature at a first location in integrated gate driver 600, and south thermal sensor 620B may sense a temperature at a second location in integrated gate driver 600. Self-test controller 625 may control a self-test function of integrated gate driver 600, such as during an initialization of the integrated gate driver 600 following a power on event of inverter 110, for example.

Command manager 630 may control commands received from communication manager 605 issued to the north switches control and diagnostics controller 650N and south switches control and diagnostics controller 650S. Waveform adjuster 635 may control a waveform timing and shape of commands received from communication manager 605 issued to the north switches control and diagnostics controller 650N and south switches control and diagnostics controller 650S. Memory 640 may include one or more volatile and non-volatile storage media for operation of integrated gate driver 600. North switches control and diagnostics controller 650N may send one or more signals to a north group of one or more switches, such as north switches 144A-N, for example, to control an operation of the north group of one or more switches, and may receive one or more signals from the north group of one or more switches that provide information about the north group of one or more switches. South switches control and diagnostics controller 650S may send one or more signals to a south group of one or more switches, such as south switches 144A-S, for example, to control an operation of the south group of one or more switches, and may receive one or more signals from the south group of one or more switches that provide information about the south group of one or more switches. As stated above, the terms north and south are merely used for reference, and north switches control and diagnostics controller 650N may send one or more signals to the south group of one or more switches, and south switches control and diagnostics controller 650S may send one or more signals to the north group of one or more switches.

As shown in FIG. 6, integrated gate driver 600 may include connection points for positive voltage pin 601, command pin 602, message pin 603, and negative voltage pin 604. Integrated gate driver 600 may include connection points for north gate trace 621, south gate trace 622, north sense trace 623, and south sense trace 624. North switches control and diagnostics controller 650N and south switches control and diagnostics controller 650S may include circuitry as needed to monitor and control the north group of one or more switches and the south group of one or more switches. Communication manager 605 may control inter-controller communications to and from integrated gate driver 600 over one or more of command pin 602 or message pin 603.

For example, north gate trace 621 may be driven, based on command pin 602, with varying source gate current drivers and varying sink gate current drivers using power from positive voltage pin 601 and negative voltage pin 604. The source gate current drivers may have varying values for the turn-on period, and the sink gate current drivers may have varying values for the turn-off period of the north group of one or more switches, respectively. The source gate current drivers and sink gate current drivers may be dynamically selected by operation of respective switches based on the respective turn-on and turn-off control signals from north switches control and diagnostics controller 650N. The source gate current drivers and sink gate current drivers may be selected using sense and control methods in order to drive the gate terminals of the north group of one or more switches to minimize switching losses based on one or more of variation in intrinsic parameters of the north group of one or more switches, parameter drift over the life of the north group of one or more switches, or an operating temperature of the north group of one or more switches. As shown in FIG. 6, south switches control and diagnostics controller 650S may operate in a similar manner as north switches control and diagnostics controller 650N.

Figure 7:
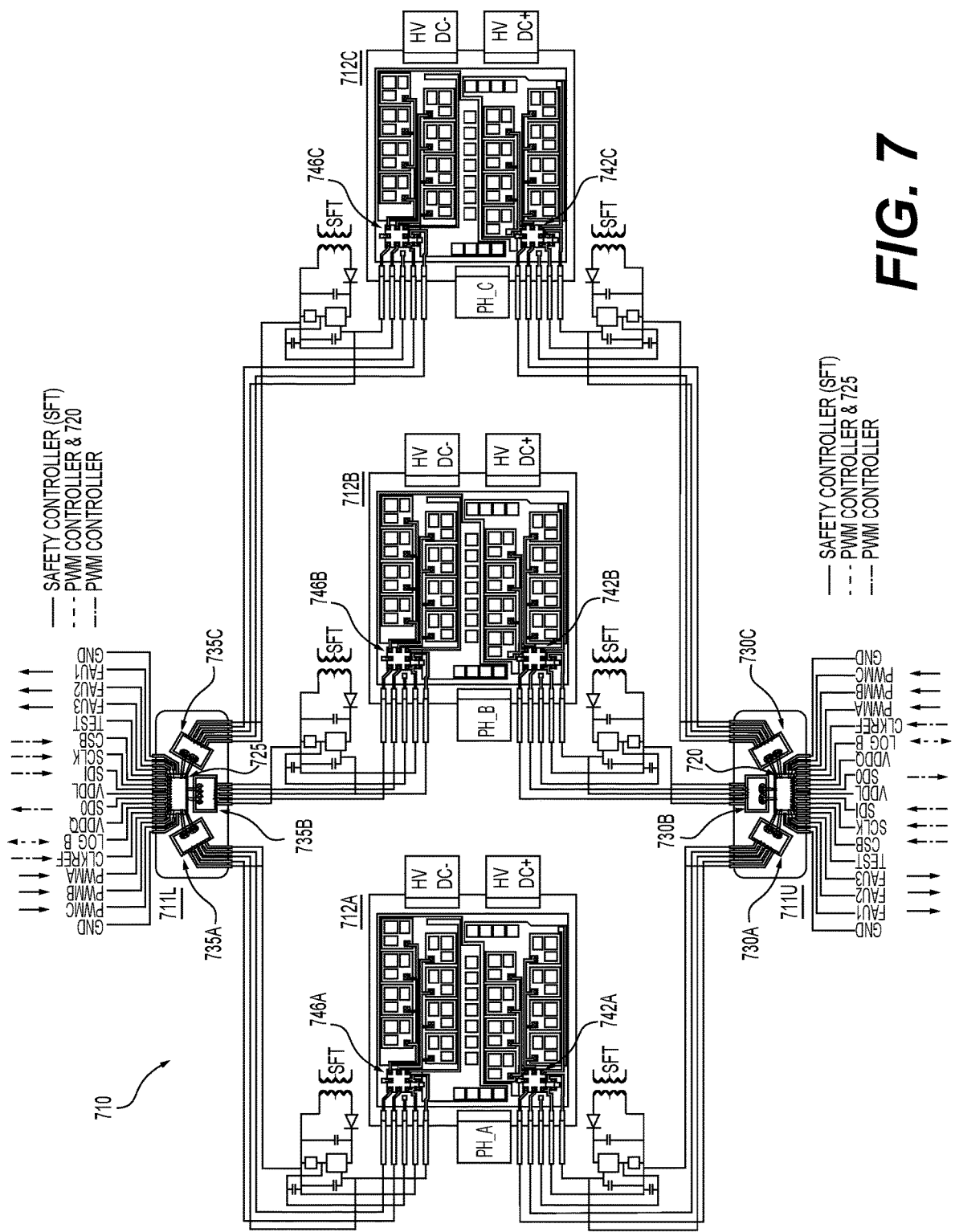
FIG. 7 depicts an exemplary connection diagram for a system including an integrated gate driver, according to one or more embodiments.
Figure 8:
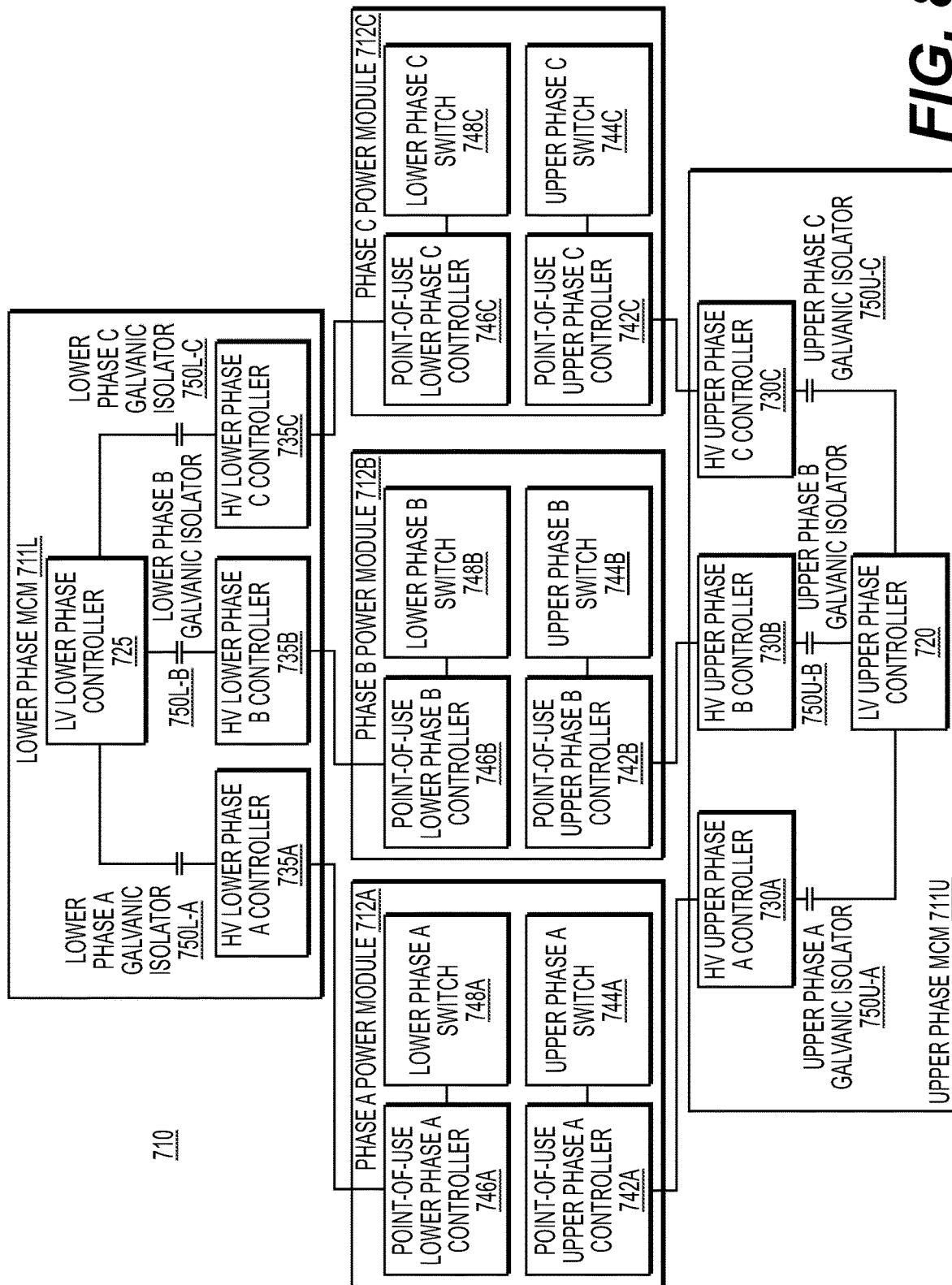
FIG. 8 depicts an exemplary block diagram for a system including a three channel galvanic isolator and an integrated gate driver architecture, according to one or more embodiments.

FIG. 7 depicts an exemplary connection diagram for a system 710 including an integrated gate driver, according to one or more embodiments. FIG. 8 depicts an exemplary block diagram for a system 710 including a three channel galvanic isolator and an integrated gate driver architecture, according to one or more embodiments. As shown in FIG. 7 and FIG. 8, system 710 may include upper phase multi-chip module 711U, lower phase multi-chip module 711L, phase A power module 712A, phase B power module 712B, and phase C power module 712C. Upper phase multi-chip module 711U may include low voltage upper phase controller 720, high voltage upper phase A controller 730A, high voltage upper phase B controller 730B, and high voltage upper phase C controller 730C. Lower phase multi-chip module 711L may include low voltage lower phase controller 725, high voltage lower phase A controller 735A, high voltage lower phase B controller 735B, and high voltage lower phase C controller 735C.

Phase A power module 712A may include a positive power connection (HVDC+), a negative power connection (HVDC−), a phase A connection (PH_A), point-of-use lower phase A controller 746A, lower phase A power switch 748A, point-of-use upper phase A controller 742A, and upper phase A power switch 744A. Phase B power module 712B may include a positive power connection (HVDC+), a negative power connection (HVDC−), a phase B connection (PH_B), point-of-use lower phase B controller 746B, lower phase B power switch 748B, point-of-use upper phase B controller 742B, and upper phase B power switch 744B. Phase C power module 712C may include a positive power connection (HVDC+), a negative power connection (HVDC−), a phase C connection (PH_C), point-of-use lower phase C controller 746C, lower phase C power switch 748C, point-of-use upper phase C controller 742C, and upper phase C power switch 744C.

System 710 may be an implementation of a portion of inverter 110, for example. Upper phase multi-chip module 711U may be an implementation of low voltage upper phase controller 120, high voltage upper phase controller 130, and a galvanic isolator, such as galvanic isolator 150, for example. Lower phase multi-chip module 711L may be an implementation of low voltage lower phase controller 125, high voltage lower phase controller 135, and a galvanic isolator, such as galvanic isolator 150, for example. Phase A power module 712A may be an implementation of upper phase power module 140 and lower phase power module 145, for example. Phase B power module 712B may be an implementation of upper phase power module 140 and lower phase power module 145, for example. Phase C power module 712C may be an implementation of upper phase power module 140 and lower phase power module 145, for example.

Point-of-use upper phase A controller 742A may be an implementation of controller 142A or integrated gate driver 600, for example. Point-of-use upper phase B controller 742B may be an implementation of point-of-use upper phase B controller 142B or integrated gate driver 600, for example. Point-of-use upper phase C controller 742C may be an implementation of point-of-use upper phase C controller 142C or integrated gate driver 600, for example. Similarly, point-of-use lower phase A controller 746A, point-of-use lower phase B controller 746B, and point-of-use lower phase C controller 746C may be implementations of individual phase controllers of point-of-use lower phase controller 146 or integrated gate driver 600.

Upper phase A power switch 744A may be an implementation of upper phase A switches 144A, for example. Upper phase B power switch 744B may be an implementation of upper phase B switches 144B, for example. Upper phase C power switch 744C may be an implementation of upper phase C switches 144C, for example. Similarly, lower phase A power switch 748A, lower phase B power switch 748B, and lower phase C power switch 748C may be implementations of individual phase power switches of lower phase switches 148.

Low voltage upper phase controller 720, of upper phase multi-chip module 711U, may communicate with one or more of a safety controller, a PWM controller (such as inverter controller 300, for example), or low voltage lower phase controller 725 of lower phase multi-chip module 711L. Based on this communication, low voltage upper phase controller 720 may communicate with high voltage upper phase A controller 730A via upper phase A galvanic isolator 750U-A, high voltage upper phase B controller 730B via upper phase A galvanic isolator 750U-B, and high voltage upper phase C controller 730C via upper phase A galvanic isolator 750U-C.

Based on the communication with low voltage upper phase controller 720, high voltage upper phase A controller 730A may communicate with point-of-use upper phase A controller 742A. Based on this communication with high voltage upper phase A controller 730A, point-of-use upper phase A controller 742A may control upper phase A power switch 744A to control a current between the positive power connection (HVDC+) and phase A connection (PH_A) of phase A power module 712A, which may control a flow of current between a positive terminal of battery 195 and a phase A of motor 190, for example. Point-of-use upper phase A controller 742A may provide information about upper phase A power switch 744A to high voltage upper phase A controller 730A, which may communicate this information to low voltage upper phase controller 720, which may communicate this information to one or more of the safety controller, PWM controller, or low voltage lower phase controller 725 of lower phase multi-chip module 711L.

Based on the communication with low voltage upper phase controller 720, high voltage upper phase B controller 730B may communicate with point-of-use upper phase B controller 742B. Based on this communication with high voltage upper phase B controller 730B, point-of-use upper phase B controller 742B may control upper phase B power switch 744B to control a current between the positive power connection (HVDC+) and phase B connection (PH_B) of phase B power module 712B, which may control a flow of current between a positive terminal of battery 195 and a phase B of motor 190, for example. Point-of-use upper phase B controller 742B may provide information about upper phase B power switch 744B to high voltage upper phase B controller 730B, which may communicate this information to low voltage upper phase controller 720, which may communicate this information to one or more of the safety controller, PWM controller, or low voltage lower phase controller 725 of lower phase multi-chip module 711L.

Based on the communication with low voltage upper phase controller 720, high voltage upper phase C controller 730C may communicate with point-of-use upper phase C controller 742C. Based on this communication with high voltage upper phase C controller 730C, point-of-use upper phase C controller 742C may control upper phase C power switch 744C to control a current between the positive power connection (HVDC+) and phase C connection (PH_C) of phase C power module 712C, which may control a flow of current between a positive terminal of battery 195 and a phase C of motor 190, for example. Point-of-use upper phase C controller 742C may provide information about upper phase C power switch 744C to high voltage upper phase C controller 730C, which may communicate this information to low voltage upper phase controller 720, which may communicate this information to one or more of the safety controller, PWM controller, or low voltage lower phase controller 725 of lower phase multi-chip module 711L.

Low voltage lower phase controller 725, of lower phase multi-chip module 711L, may communicate with one or more of a safety controller, a PWM controller (such as inverter controller 300, for example), or low voltage upper phase controller 720 of upper phase multi-chip module 711U. Based on this communication, low voltage lower phase controller 725 may communicate with high voltage lower phase A controller 735A via lower phase A galvanic isolator 750L-A, high voltage lower phase B controller 735B via lower phase A galvanic isolator 750L-B, and high voltage lower phase C controller 735C via lower phase A galvanic isolator 750L-C.

Based on the communication with low voltage lower phase controller 725, high voltage lower phase A controller 735A may communicate with point-of-use lower phase A controller 746A. Based on this communication with high voltage lower phase A controller 735A, point-of-use lower phase A controller 746A may control lower phase A power switch 748A to control a current between the negative power connection (HVDC−) and phase A connection (PH_A) of phase A power module 712A, which may control a flow of current between a negative terminal of battery 195 and a phase A of motor 190, for example. Point-of-use lower phase A controller 746A may provide information about lower phase A power switch 748A to high voltage lower phase A controller 735A, which may communicate this information to low voltage lower phase controller 725, which may communicate this information to one or more of the safety controller, PWM controller, or low voltage upper phase controller 720 of upper phase multi-chip module 711U.

Based on the communication with low voltage lower phase controller 725, high voltage lower phase B controller 735B may communicate with point-of-use lower phase B controller 746B. Based on this communication with high voltage lower phase B controller 735B, point-of-use lower phase B controller 746B may control associated lower phase B power switch 748B to control a current between the negative power connection (HVDC−) and phase B connection (PH_B) of phase B power module 712B, which may control a flow of current between a negative terminal of battery 195 and a phase B of motor 190, for example. Point-of-use lower phase B controller 746B may provide information about lower phase B power switch 748B to high voltage lower phase B controller 735B, which may communicate this information to low voltage lower phase controller 725, which may communicate this information to one or more of the safety controller, PWM controller, or low voltage upper phase controller 720 of upper phase multi-chip module 711U.

Based on the communication with low voltage lower phase controller 725, high voltage lower phase C controller 735C may communicate with point-of-use lower phase C controller 746C. Based on this communication with high voltage lower phase C controller 735C, point-of-use lower phase C controller 746C may control lower phase C power switch 748C to control a current between the negative power connection (HVDC−) and phase C connection (PH_C) of phase C power module 712C, which may control a flow of current between a negative terminal of battery 195 and a phase C of motor 190, for example. Point-of-use lower phase C controller 746C may provide information about lower phase C power switch 748C to high voltage lower phase C controller 735C, which may communicate this information to low voltage lower phase controller 725, which may communicate this information to one or more of the safety controller, PWM controller, or low voltage upper phase controller 720 of upper phase multi-chip module 711U.

System 710 may integrate point-of-use upper phase B controller 742B, for example, into phase B power module 712B. Point-of-use upper phase B controller 742B may be an application-specific integrated circuit (ASIC), for example. Phase B power module 712B may include upper phase B power switch 744B and lower phase B power switch 748B, and may incorporate point-of-use upper phase B controller 742B and point-of-use lower phase B controller 746B to control upper phase B power switch 744B and lower phase B power switch 748B, respectively. One or more of upper phase B power switch 744B and lower phase B power switch 748B may include one or more SiC dies. Point-of-use upper phase B controller 742B, for example, may locally sense a current of an SiC die by sensing a voltage drop across the source metallization. Point-of-use upper phase B controller 742B may include local precision thermal sensing of the SiC die and an environment of the SiC die, without the need for integrated on die temperature sense circuitry, which may provide improved die thermal performance or lower die cost. Phase B power module 712B may closely couple gate drive circuitry of point-of-use upper phase B controller 742B, for example, to one or more SiC bare dies that make up upper phase B power switch 744B, which may reduce switching losses.

Point-of-use upper phase B controller 742B may include a gate drive profile as a function of one or more of SiC FET gate-to-source voltage, temperature, or known gate-to-source voltage thresholds that may change over the life of the SiC FET. Point-of-use upper phase B controller 742B may measure and store specific SiC device characteristics in a memory, such as memory 640, for example, of the integrated gate driver, and may provide custom tailored gate drive profiles based on the stored SiC device characteristics. Point-of-use upper phase B controller 742B may use a two-wire bus (e.g. command pin 602 and message pin 603) for communication, which may reduce a number of connections to a galvanic isolated device. System 710 may provide a three HVIC to one LVIC using upper phase multi-chip module 711U for upper switches of a three-phase bridge and lower phase multi-chip module 711L for lower switches of a three-phase bridge.

Point-of-use upper phase B controller 742B may provide direct current sensing, which may provide less stress on SiC devices in the event of a short circuit event. Point-of-use upper phase B controller 742B may provide precise temperature measurement, which may allow operation at a higher average temperature for system optimization. Point-of-use upper phase B controller 742B may reduce switching losses due to one or more of a tightly coupled layout, usage of SiC device characteristics, usage of temperature, and usage of previous cycle current. Reduced switching losses may provide an increased range for an electric vehicle. Reduced switching losses may provide a higher current output of the power switch or module. System 710 may provide safety independence as required in permanent magnet machines for active short circuit discharge during device failure. The above description uses phase B power module 712B and point-of-use upper phase B controller 742B as an example, and similar description may also apply to phase A power module 712A and phase C power module 712C and associated components.

One or more embodiments may integrate a gate driver into the power switch, as an integrated gate driver or point-of-use controller. The integrated gate driver may be an application-specific integrated circuit (ASIC), for example. A phase switch power module that includes two switches may incorporate two integrated gate drivers. One or more embodiments may locally sense current of a SiC die by sensing a voltage drop across the source metallization. One or more embodiments may include local precision thermal sensing of the SiC die and an environment of the SiC die, without the need for integrated on die temperature sense circuitry, which may provide improved die thermal performance or lower die cost. One or more embodiments may closely couple gate drive circuitry to the SiC bare die that makes up the power switch, which may reduce switching losses. One or more embodiments may include a gate drive profile as a function of one or more of SiC FET gate-to-source voltage, temperature, or known gate-to-source voltage thresholds that may change over the life of the SiC FET. One or more embodiments may measure and store specific SiC device characteristics in a memory, such as an EEPROM, for example, of the integrated gate driver, and may provide custom tailored gate drive profiles based on the stored SiC device characteristics. One or more embodiments may use a two-wire bus for communication, which may reduce a number of connections to a galvanic isolated device. One or more embodiments may provide a three HVIC to one LVIC using a first multi-chip module for upper switches of a three-phase bridge and a second multi-chip module for lower switches of a three-phase bridge.

One or more embodiments may provide direct current sensing, which may provide less stress on SiC devices in the event of a short circuit event. One or more embodiments may provide precise temperature measurement, which may allow operation at a higher average temperature for system optimization. One or more embodiments may reduce switching losses due to one or more of a tightly coupled layout, usage of SiC device characteristics, usage of temperature, and usage of previous cycle current. Reduced switching losses may provide an increased range for an electric vehicle. Reduced switching losses may provide a higher current output of the power switch or module. One or more embodiments may provide safety independence as required in permanent magnet machines for active short circuit discharge during device failure.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:
    an inverter configured to convert DC power from a battery to AC power to drive a motor, wherein the inverter includes:
    a first power module including:
        a first connection;
        a second connection;
        a first power switch including a first gate terminal, the first power switch configured to control a first flow of current between the first connection and the second connection based on a first signal to the first gate terminal; and
        a first point-of-use controller configured to provide the first signal to the first gate terminal to control the first power switch.

2. The system of claim 1, wherein the first power module further comprises:
    a third connection;
    a second power switch including a second gate terminal, the second power switch configured to control a second flow of current between the third connection and the second connection based on a second signal to the second gate terminal; and
    a second point-of-use controller configured to provide the second signal to the second gate terminal to control the second power switch.

3. The system of claim 2, wherein the first connection is configured to be connected to a positive terminal of the battery, the second connection is configured to be connected to a phase terminal of the motor, and the third connection is configured to be connected to a negative terminal of the battery.

4. The system of claim 1, wherein the first power module further comprises:
    a command pin,
    wherein the first point-of-use controller is further configured to receive a gate command via the command pin, and provide the first signal to the first gate terminal, based on the received gate command.

5. The system of claim 1, wherein the first power switch includes one or more silicon carbide dies.

6. The system of claim 1, wherein the first point-of-use controller includes a first gate drive controller and a second gate drive controller.

7. The system of claim 1, wherein the inverter further includes:
    a second power module; and
    a third power module.

8. The system of claim 1, further comprising:
    the battery configured to supply the DC power to the inverter; and
    the motor configured to receive the AC power from the inverter to drive the motor.

9. A system including:
    a power module for an inverter for an electric vehicle, the power module comprising:
    a first connection;
    a second connection;
    a first power switch including a first gate terminal, the first power switch configured to control a first flow of current between the first connection and the second connection based on a first signal to the first gate terminal; and
    a first point-of-use controller configured to provide the first signal to the first gate terminal to control the first power switch.

10. The system of claim 9, wherein the power module further comprises:
    a third connection;
    a second power switch including a second gate terminal, the second power switch configured to control a second flow of current between the third connection and the second connection based on a second signal to the second gate terminal; and
    a second point-of-use controller configured to provide the second signal to the second gate terminal to control the second power switch.

11. The system of claim 10, wherein the first connection is configured to be connected to a positive terminal of a battery of the electric vehicle, the second connection is configured to be connected to a phase terminal of a motor of the electric vehicle, and the third connection is configured to be connected to a negative terminal of the battery.

12. The system of claim 9, wherein the power module further comprises:
    a command pin,
    wherein the first point-of-use controller is further configured to receive a gate command via the command pin, and provide the first signal to the first gate terminal, based on the received gate command.

13. The system of claim 9, wherein the first power switch includes one or more silicon carbide dies.

14. The system of claim 9, wherein the first point-of-use controller includes a first gate drive controller and a second gate drive controller.

15. A system comprising:
    a point-of-use controller for a power module for an inverter, the point-of-use controller configured to:
    receive a gate command; and
    generate a signal for a gate terminal of a power switch of the power module, based on the received gate command.

16. The system of claim 15, wherein the point-of-use controller is further configured to:
    receive a sensing signal from the power switch; and
    generate the signal for the gate terminal based on the received sensing signal.

17. The system of claim 15, wherein the point-of-use controller is further configured to:
    control a current through the power switch using the signal for the gate terminal.

18. The system of claim 15, wherein the point-of-use controller is further configured to:

sense a gate-to-source voltage of the power switch during one or more of a turn-on event of the power switch or a turn-off event of the power switch.

19. The system of claim 15, wherein the point-of-use controller is further configured to generate the signal for the gate terminal based on one or more of a variation in intrinsic parameters of the power switch, a parameter drift over a life of the power switch, or an operating temperature of the power switch.

20. The system of claim 15, wherein the point-of-use controller is configured to control a first group of silicon carbide dies of the power switch and to control a second group of silicon carbide dies of the power switch independently from the first group.

* * * * *